United States Patent
Hattori et al.

(10) Patent No.: US 8,649,894 B2
(45) Date of Patent: Feb. 11, 2014

(54) METHOD AND DEVICE FOR CONTROLLING CIRCUIT BOARD POSITIONS DURING THE ASSEMBLY OF ELECTRONIC COMPONENTS

(75) Inventors: Tomohiko Hattori, Chiryu (JP); Hiroshi Tsuta, Chiryu (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 306 days.

(21) Appl. No.: 13/166,244

(22) Filed: Jun. 22, 2011

(65) Prior Publication Data

US 2012/0011714 A1   Jan. 19, 2012

(30) Foreign Application Priority Data

Jul. 15, 2010   (JP) .................................. 2010-160691

(51) Int. Cl.
| | |
|---|---|
| *G06F 19/00* | (2011.01) |
| *B23P 19/00* | (2006.01) |
| *H05K 3/30* | (2006.01) |
| *H01L 21/68* | (2006.01) |
| *H01R 43/20* | (2006.01) |

(52) U.S. Cl.
CPC ............ *H01L 21/681* (2013.01); *H01R 43/205* (2013.01)
USPC ............... 700/114; 700/117; 29/832; 29/739; 29/740; 348/86

(58) Field of Classification Search
USPC ........ 700/114, 117; 29/832, 739, 740; 348/86
See application file for complete search history.

(56) References Cited

U.S. PATENT DOCUMENTS

| | | | | |
|---|---|---|---|---|
| 3,992,772 | A * | 11/1976 | Scannell et al. ................. | 29/833 |
| 4,283,847 | A * | 8/1981 | May ................................. | 29/832 |
| 4,436,806 | A * | 3/1984 | Rendulic et al. .............. | 430/311 |
| 4,744,139 | A * | 5/1988 | Shinano et al. .................. | 29/741 |
| 4,846,032 | A * | 7/1989 | Jampathom et al. .............. | 83/51 |
| 5,010,474 | A * | 4/1991 | Tsuruta et al. ................... | 700/57 |
| 5,084,962 | A * | 2/1992 | Takahashi et al. .............. | 29/833 |

(Continued)

FOREIGN PATENT DOCUMENTS

| | | | | | |
|---|---|---|---|---|---|
| JP | 03187299 | A | * | 8/1991 | ............ H05K 13/02 |
| JP | 2003-31991 | | | 1/2003 | |
| JP | 2012038755 | A | * | 2/2012 | |

OTHER PUBLICATIONS

Altron Inc., "Board Design Guidelines", 2003, Retrieved from the Internet on Jun. 10, 2013 at "www.altronmfg.com".*

(Continued)

*Primary Examiner* — Mohammad Ali
*Assistant Examiner* — Kelvin Booker
(74) *Attorney, Agent, or Firm* — Oblon, Spivak, McClelland, Maier & Neustadt, L.L.P.

(57) ABSTRACT

A method for controlling a board stopping position includes a calculation step for calculating an extended length of the electronic component mounted on the board and extended from the board end portion in the transfer direction by one of the electronic component mounting machines; and a correcting and stopping step for correcting a stopping timing of the conveyer belt to be stopped in response to the detection signal which is outputted from the board sensor and stopping the board at the mounting position, based on the calculated extended length of the electronic component in a subsequent stage electronic component mounting machine arranged subsequent to the one of the electronic component mounting machines.

6 Claims, 5 Drawing Sheets

(56) References Cited

U.S. PATENT DOCUMENTS

| | | | |
|---|---|---|---|
| 5,105,532 A * | 4/1992 | Fritsch | 29/740 |
| 5,172,468 A * | 12/1992 | Tanaka et al. | 29/721 |
| 5,233,745 A * | 8/1993 | Morita | 29/705 |
| 5,235,739 A * | 8/1993 | Pedall | 29/740 |
| 5,249,349 A * | 10/1993 | Kuinose et al. | 29/721 |
| 5,383,270 A * | 1/1995 | Iwatsuka et al. | 29/840 |
| 5,628,107 A * | 5/1997 | Nushiyama et al. | 29/740 |
| 5,964,031 A * | 10/1999 | Smith et al. | 29/832 |
| 6,145,190 A * | 11/2000 | Shin et al. | 29/840 |
| 6,256,869 B1 * | 7/2001 | Asai et al. | 29/740 |
| 6,260,260 B1 * | 7/2001 | Suhara | 29/740 |
| 6,295,728 B1 * | 10/2001 | Shin et al. | 29/840 |
| 6,314,640 B1 * | 11/2001 | Yoshida et al. | 29/834 |
| 6,334,840 B1 * | 1/2002 | Asai et al. | 483/1 |
| 6,374,484 B1 * | 4/2002 | Yoshida et al. | 29/740 |
| 6,471,045 B1 * | 10/2002 | Harden | 198/817 |
| 6,513,233 B1 * | 2/2003 | Nakao et al. | 29/740 |
| 6,550,134 B2 * | 4/2003 | Asai et al. | 29/833 |
| 6,594,531 B2 * | 7/2003 | Eshelman et al. | 700/28 |
| 6,594,887 B1 * | 7/2003 | Okuda et al. | 29/739 |
| 6,622,379 B1 * | 9/2003 | Kano | 29/740 |
| 6,662,437 B2 * | 12/2003 | Kawashima | 29/740 |
| 6,788,989 B2 * | 9/2004 | Kodama | 700/117 |
| 6,862,803 B2 * | 3/2005 | Kawase et al. | 29/832 |
| 6,886,247 B2 * | 5/2005 | Drussel et al. | 29/847 |
| 6,892,446 B2 * | 5/2005 | Hwang et al. | 29/740 |
| 6,976,304 B2 * | 12/2005 | Nakamura et al. | 29/740 |
| 6,986,200 B2 * | 1/2006 | Hwang et al. | 29/833 |
| 7,036,213 B2 * | 5/2006 | Kabeshita et al. | 29/740 |
| 7,036,215 B2 * | 5/2006 | Kodama | 29/832 |
| 7,043,820 B2 * | 5/2006 | Suhara | 29/564.1 |
| 7,050,623 B1 * | 5/2006 | Fukuda et al. | 382/151 |
| 7,065,866 B2 * | 6/2006 | Yoshida et al. | 29/834 |
| 7,165,318 B2 * | 1/2007 | Nakamura et al. | 29/740 |
| 7,231,709 B2 * | 6/2007 | Yoshida et al. | 700/117 |
| 7,281,323 B2 * | 10/2007 | Hwang | 29/834 |
| 7,313,860 B2 * | 1/2008 | Takahashi et al. | 29/740 |
| 7,337,533 B2 * | 3/2008 | Imafuku et al. | 29/739 |
| 7,353,589 B2 * | 4/2008 | Kawasumi et al. | 29/740 |
| 7,356,918 B2 * | 4/2008 | Okuda et al. | 29/833 |
| 7,549,221 B2 * | 6/2009 | Kim et al. | 29/832 |
| 7,712,652 B2 * | 5/2010 | Morita et al. | 228/180.22 |
| 7,885,718 B2 * | 2/2011 | Yano et al. | 700/65 |
| 7,885,723 B2 * | 2/2011 | Chida et al. | 700/114 |
| 8,035,093 B2 * | 10/2011 | Brumbaugh et al. | 250/559.4 |
| 8,302,291 B2 * | 11/2012 | Ao et al. | 29/740 |
| 8,319,831 B2 * | 11/2012 | Koike et al. | 700/245 |
| 8,384,253 B2 * | 2/2013 | Yman et al. | 310/12.31 |
| 8,448,834 B2 * | 5/2013 | Hattori et al. | 228/9 |
| 2001/0002509 A1 * | 6/2001 | Suhara | 29/834 |
| 2002/0011000 A1 * | 1/2002 | Yoshida et al. | 29/834 |
| 2002/0069517 A1 * | 6/2002 | Miura et al. | 29/743 |
| 2002/0092157 A1 * | 7/2002 | Yoshida et al. | 29/740 |
| 2002/0108239 A1 * | 8/2002 | Isogai et al. | 29/834 |
| 2002/0189090 A1 * | 12/2002 | Shirakawa | 29/834 |
| 2003/0040829 A1 * | 2/2003 | Coquelet et al. | 700/117 |
| 2003/0070289 A1 * | 4/2003 | Hwang et al. | 29/833 |
| 2003/0088974 A1 * | 5/2003 | Nakamura et al. | 29/740 |
| 2004/0033128 A1 * | 2/2004 | Kabeshita et al. | 414/935 |
| 2004/0098857 A1 * | 5/2004 | Kawada | 29/740 |
| 2004/0128827 A1 * | 7/2004 | Shimizu et al. | 29/739 |
| 2004/0211059 A1 * | 10/2004 | Kim et al. | 29/832 |
| 2005/0144779 A1 * | 7/2005 | Nakamura et al. | 29/740 |
| 2006/0048380 A1 * | 3/2006 | Okuda et al. | 29/832 |
| 2006/0048383 A1 * | 3/2006 | Nishiwaki et al. | 29/833 |
| 2006/0112545 A1 * | 6/2006 | Hwang | 29/834 |
| 2006/0200973 A1 * | 9/2006 | Imafuku et al. | 700/125 |
| 2006/0200974 A1 * | 9/2006 | Yoshida et al. | 29/739 |
| 2006/0230610 A1 * | 10/2006 | Kim et al. | 29/832 |
| 2007/0074390 A1 * | 4/2007 | Ota et al. | 29/833 |
| 2007/0124922 A1 * | 6/2007 | Kawasumi et al. | 29/739 |
| 2008/0005892 A1 * | 1/2008 | Chida et al. | 29/739 |
| 2008/0066953 A1 * | 3/2008 | Kanai | 174/260 |
| 2008/0163480 A1 * | 7/2008 | Kawasumi et al. | 29/740 |
| 2008/0250636 A1 * | 10/2008 | Okuda et al. | 29/834 |
| 2008/0309260 A1 * | 12/2008 | Kanai et al. | 318/38 |
| 2009/0043413 A1 * | 2/2009 | Yano et al. | 700/95 |
| 2009/0049680 A1 * | 2/2009 | Morita | 29/740 |
| 2009/0126189 A1 * | 5/2009 | Okada et al. | 29/832 |
| 2009/0183361 A1 * | 7/2009 | Takahira et al. | 29/739 |
| 2009/0249615 A1 * | 10/2009 | Yonemitsu et al. | 29/740 |
| 2010/0050426 A1 * | 3/2010 | Shimizu et al. | 29/739 |
| 2010/0058579 A1 * | 3/2010 | Larsson | 29/739 |
| 2010/0150580 A1 * | 6/2010 | Brumbaugh et al. | 399/16 |
| 2010/0245558 A1 * | 9/2010 | Koike et al. | 700/117 |
| 2011/0016708 A1 * | 1/2011 | Yang et al. | 29/832 |
| 2011/0023296 A1 * | 2/2011 | Muraoka et al. | 29/832 |
| 2011/0232082 A1 * | 9/2011 | Kim et al. | 29/740 |
| 2012/0031952 A1 * | 2/2012 | Hattori et al. | 228/9 |
| 2012/0139366 A1 * | 6/2012 | Yman et al. | 310/12.29 |
| 2013/0133187 A1 * | 5/2013 | Yman et al. | 29/739 |
| 2013/0133192 A1 * | 5/2013 | Yang et al. | 29/832 |

OTHER PUBLICATIONS

Ayob, M.; Cowling, P. and Kendall, G., "Optimisation for Surface Mount Placement Machines", 2002, IEEE International Conference on Industrial Technology, vol. 1, pp. 498-503.*
Ayob, M. and Kendall, G., "A Survey of Surface Mount Device Placement Machine Optimisation: Machine Classification", 2008, European Journal of Operational Research, vol. 186, pp. 893-914.*
Ayob, M. and Kendall, G., "Real-Time Scheduling for Multi-Headed Placement Machine", 2003, Retrieved from the Internet on Jun. 10, 2013 at "www.ftsm.ukm.my/masri/Masri_ISATP03.pdf".*
Burke, E.K.; Cowling, P.I. and Keuthen, R., "New Models and Heuristics for Component Placement in Printed Circuit Board Assembly", 1999, Proceedings of the 1999 International Conference on Information Intelligence and Systems, pp. 133-140.*
Hardas, C.S., "Component Placement Sequence Optimization in Printed Circuit Board Assembly using Genetic Algorithms", Dec. 2003, Thesis for Master of Science degree in Industrial Engineering at Oregon State University.*
Shih, W., "The Hybrid Deuristic System in Balancing the PCB Assembly Line of Surface Mount Technology with Multiple Placement Machines", 2009, International Journal of Electronic Business Management, vol. 7, No. 1, pp. 37-44.*

* cited by examiner (1)

(2)

METHOD AND DEVICE FOR CONTROLLING CIRCUIT BOARD POSITIONS DURING THE ASSEMBLY OF ELECTRONIC COMPONENTS

INCORPORATION BY REFERENCE

This application is based on and claims priority under 35 U.S.C. Sec. 119 with respect to Japanese Application No. 2010-160691 filed on Jul. 15, 2010, the entire content of which is incorporated herein by reference.

BACKGROUND OF THE INVENTION

1. Field of the Invention

The present invention relates to a method and a device for controlling a board stopping position in a board transfer device provided in, such as, an electronic component mounting machine or the like wherein a board is stopped at a target position on a transfer pathway.

2. Discussion of the Related Art

As equipment for manufacturing a board on which various kinds of electronic components are mounted, a cream solder printing device, electronic component mounting machine, a reflow soldering device and inspection device are used for manufacturing and in many cases, these devices and machines are operatively connected with one another by a board transfer device thereby to structure a board production line. Among these devices, the electronic component mounting machine is structured mainly by a board transfer device for bringing in and stopping a board at a position where the components are to be mounted, a component supply device for supplying electronic components and a component mounting device for mounting the electronic component to a predetermined position on the board. It may be difficult for a single mounting machine to mount all of the desired different kinds of electronic components and accordingly, the electronic component mounting line is sometimes formed by arranging a plurality of modularized mounting machines in-series.

It is popular for a board transfer device used for a board production line or an electronic component mounting line to transfer the board placed on a conveyer which forms the transfer route or pathway. Further, as one of the controlling methods for stopping the board at the target position, there has been introduced a method in which the board is transferred further by a predetermined distance when a board sensor provided at a position of the transfer pathway detects a board end portion. According to this method for controlling the board stopping position, when an electronic component is mounted on the board extending beyond the end portion of the board and the entire length of the board with the component mounted thereon becomes elongated, stopping the board at the target position becomes difficult due to possible erroneous detection of the sensor. For example, when a connector part is mounted on the board with a portion extending beyond the front end portion of the board, the board sensor detects the front end portion of the connector part, which may lead to an occurrence of detection error by the value of extended length of the connector part. Then the board is stopped before the target position by the extended length and detecting of correct stopping position becomes difficult. This will lead to occurrence of difficulties in reading a reference mark on the board and/or difficulties in mounting electronic components by the component mounting device.

An example of the technology for maintaining and improving accuracy of stopping position controlling by detecting an end portion of the board has been introduced in JP2003-31991A in which a method and a device for detecting a circuit board for a circuit board production device are disclosed. The circuit board detecting method according to JP2003-31991A is performed by utilizing a first board detecting sensor for detecting a reflected light reflected from a board by irradiating the board with diffusion light and a second board detecting sensor for detecting a reflection light reflected from the board by irradiating the board with converging light, wherein one of the first and the second sensors is selectively applied depending on the type of the circuit board. Thus, even a plurality of boards with perforation or recess or a circuit board with various electronic components already mounted thereon can be accurately detected with high reliability.

The method disclosed in JP2003-31991A improves the detection accuracy by selectively applying the diffusion light and the converging light depending on the type of board. Erroneous detection of the end portion of the board can be prevented by the fact that the converging light passes through the perforation or the recess and is not reflected or the fact that an amount of reflected light varies depending on the surface condition of the electronic component already mounted on the board. However, this method cannot overcome the detection error occurrence, which may be derived from the mounting of the electronic component which extends beyond the end portion of the board. It would be still difficult to accurately detect the original end portion of the board by a mere selection of diffusion light and the converging light considering that type of the component extended from the board, the amount of extension (extended length) or the extended width varies depending on the board type to be produced. Accordingly, it would be difficult to accurately stop the board at the target position on the transfer pathway.

Further, according to the method of JP2003-31991A, a plurality of sensors are necessary to be equipped and a selection control device therefor is also necessary, and accordingly there is a problem that the production cost becomes high.

SUMMARY OF THE INVENTION

The present invention has been made considering the above state of art and it is an object of the present invention to provide a simple and low-cost method and a device for controlling a board stopping position which can accurately stop a board at a desired position for mounting component in an electronic component mounting machine arranged at a subsequent stage, even an electronic component is mounted on the board to extend from the end portion of the board in the foregoing mounting machine.

Briefly, according to the present invention in a first aspect, there is provided a method for controlling a board stopping position adapted to an electronic component mounting production line formed by a plurality of electronic component mounting machines arranged in series, each including a board transfer device which transfers a board along a transfer pathway by a conveyer belt and stops the conveyer belt to stop the board thereon at a mounting position based on a detection signal which is outputted from a board sensor provided at a reference position on the transfer pathway when the board sensor detects a board end portion in a transfer direction of the board, a component supply device for supplying various kinds of electronic components which are to be mounted on the board and a component mounting device for picking the electronic component from the component supply device and mounting the picked electronic component on the board stopped at the mounting position, by moving in the transfer direction and in a direction perpendicular thereto. The method comprises a calculation step for calculating an extended length of the electronic component which is mounted on the board and extended from the board end portion in the transfer direction in one of the electronic component mounting machines and a correcting and stopping step for correcting a stopping timing of the conveyer belt to be stopped in response to the detection signal which is outputted from the board sensor and stopping the board at the mounting position, based on the calculated extended length of the electronic component in a subsequent stage electronic component mounting machine arranged subsequent to the one electronic component mounting machine.

According to the present invention in a second aspect, there is provided a device for controlling a board stopping position in an electronic component mounting production line formed by a plurality of electronic component mounting machines arranged in series, each including a board transfer device which transfers a board along a transfer pathway by a conveyer belt and stops the conveyer belt to stop the board thereon at a mounting position based on a detection signal which is outputted from a board sensor provided at a reference position on the transfer pathway when the board sensor detects a board end portion in a transfer direction of the board, a component supply device for supplying various kinds of electronic components which are to be mounted on the board and a component mounting device for picking the electronic component from the component supply device and mounting the picked electronic component on the board stopped at the mounting position, by moving in the transfer direction and in a direction perpendicular thereto, comprising a calculation means for calculating an extended length of the electronic component which is mounted on the board and extended from the board end portion in the transfer direction in one of the electronic component mounting machines and a correcting and stopping means for correcting a stopping timing of the conveyer belt to be stopped in response to the detection signal which is outputted from the board sensor and stopping the board at the mounting position, based on the calculated extended length of the electronic component in a subsequent stage electronic component mounting machine arranged subsequent to the one of electronic component mounting machines.

According to the present invention in a third aspect, there is provided a method for controlling a board mounting position in an electronic component mounting production line formed by a plurality of electronic component mounting machines arranged in series, each including a board transfer device which transfers a board along a transfer pathway by a conveyer belt and stops the conveyer belt to stop the board thereon at a mounting position based on a detection signal which is outputted from a board sensor provided at a reference position on the transfer pathway when the board sensor detects a board end portion in a transfer direction of the board, a component supply device for supplying various kinds of electronic components which are to be mounted on the board and a component mounting device for picking the electronic component from the component supply device and mounting the picked electronic component on the board stopped at the mounting position, by moving in the transfer direction and in a direction perpendicular thereto, the method comprising a calculation step for calculating an extended length of the electronic component which is mounted on the board and extended from the board end portion in the transfer direction in one of the electronic component mounting machines a stopping step for stopping the board at the mounting position in response to the detection signal from the board sensor in a subsequent stage electronic component mounting machine arranged subsequent to the one of the electronic component mounting machines and correcting and mounting step for correcting a mounting coordinate on which the electronic component is to be mounted based on the extended length of the electronic component and mounting the electronic component on the board in the subsequent stage electronic component mounting machine.

BRIEF DESCRIPTION OF THE ACCOMPANYING DRAWINGS

The foregoing and other objects and many of the attendant advantages of the present invention may readily be appreciated as the same becomes better understood by reference to the preferred embodiment of the present invention when considered in connection with the accompanying drawings, wherein like reference numerals designate the same or corresponding parts throughout several views, and in which:

FIG. 4 (2) is a plane view explaining the example of the calculation process for calculating the extended length when the connector part mounted on the board by the second electronic component mounting machine is extended beyond the front end of the board;

FIG. 5 (2) is a view explaining an example of the stopping process for stopping a normal board not having the extended length at the mounting position in the third electronic component mounting machine, wherein the stopping position of the board is indicated;

FIG. 6 (2) is a view explaining an example of the correcting and stopping process for stopping a board having the extended length shown in FIG. 4 at the mounting position in the third electronic component mounting machine, wherein the stopping position of the board is indicated;

DETAILED DESCRIPTION OF THE PREFERRED EMBODIMENT

Figure 1:
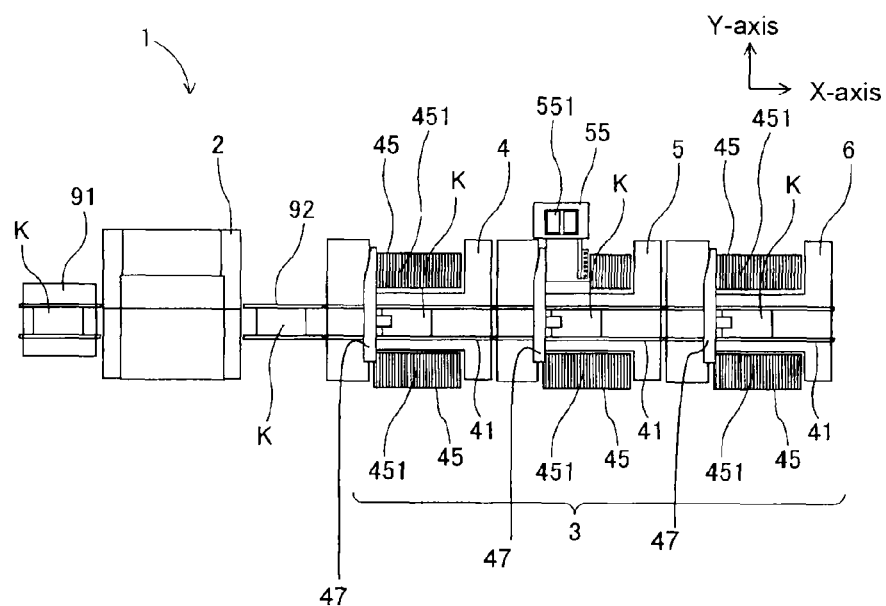
FIG. 1 is a plane view explaining a part of a board production line for implementing the board stopping position controlling method according to an embodiment of the present invention.

The board stopping position controlling method according to the embodiment of the present invention will be explained with reference to FIGS. 1 through 6 of the attached drawings. FIG. 1 shows the plane view explaining a portion of a board production line for implementing the board stopping position controlling method. The board production line 1 is formed by a board supply device (not shown), a cream solder printing device 2, an electronic component mounting line 3, a reflow soldering device (not shown), an inspection device and a control computer, etc. A first transfer device 91 is provided between the board supply device and the cream solder printing device 2 and a second transfer device 92 is provided between the cream solder printing device 2 and the electronic component mounting line 3. The first and second transfer devices are so constructed as to transfer a board K.

The electronic component mounting line 3 is equipped with a first electronic component mounting machine 4 for mounting a relatively small sized electronic component, a second electronic component mounting machine 5 for mounting a relatively large sized electronic component and others and a third electronic component mounting machine 6 for mounting a relatively small sized electronic component. The three mounting machines are arranged in series from the first to third electronic component mounting machine. The board K is transferred through the three mounting machines 4, 5 and 6 in a straight line along a transfer direction and a plurality of electronic components with different kind are mounted on the board K during the transferring process.

Figure 2:
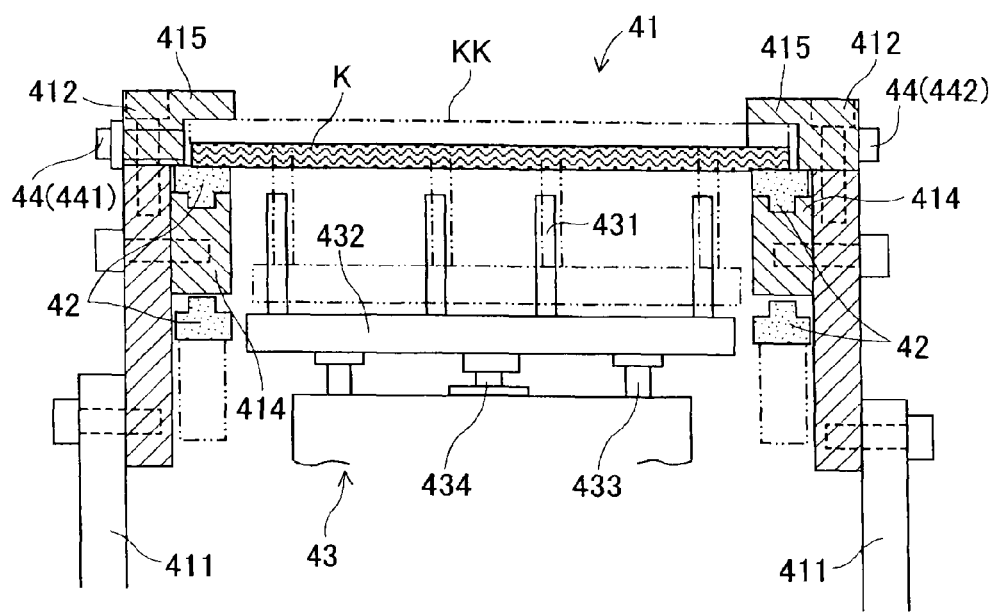
FIG. 2 is a front cross sectional view of the board transfer device of the first electronic component mounting machine.
Figure 3:
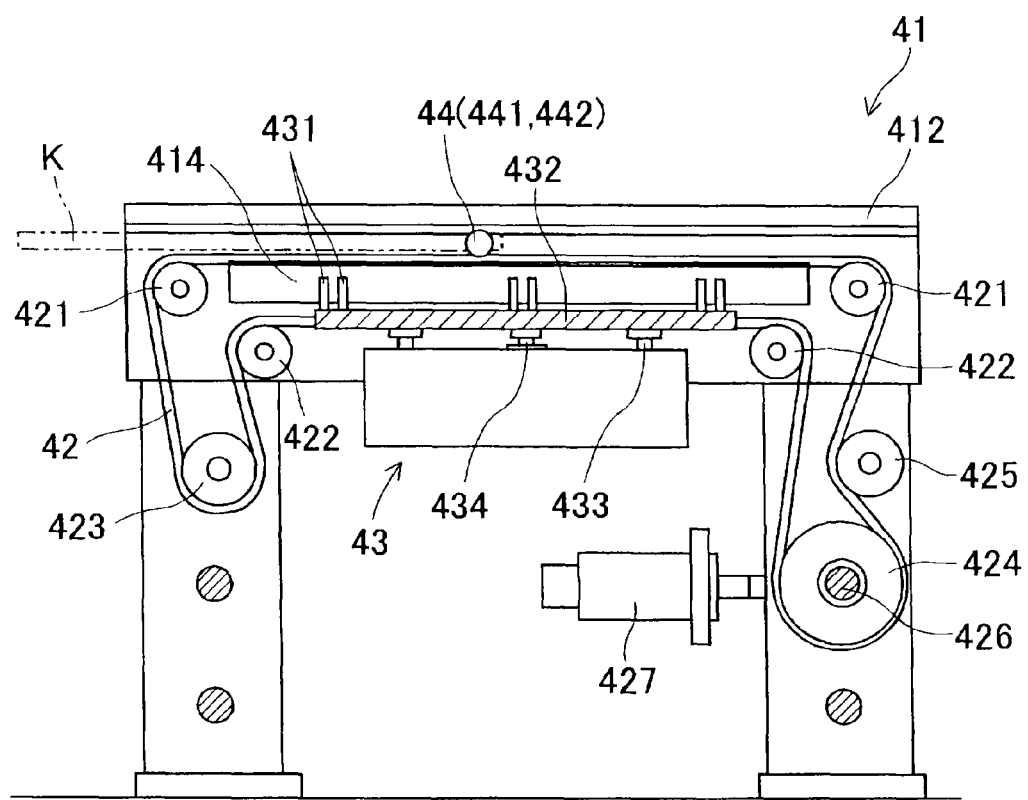
FIG. 3 is a side cross sectional view of the board transfer device of the first electronic component mounting machine.

The first electronic component mounting machine 4 is provided with a board transfer device 41, a feeder type component supply device 45 and a component mounting device 47. FIG. 2 is a front cross sectional view of the board transfer device 41 of the first electronic component mounting machine 4 and FIG. 3 is a side cross sectional view of the board transfer device 41. The board transfer device 41 is structured mainly by a pair of right and left guide rails 412 and corresponding pair of right and left conveyer belts 42, clamp device 43 and a board sensor 44. As shown in FIG. 2, the pair of guide rails 412 are attached on to a pair of right and left base portions 411 that are arranged at the right and left sides viewed from the front side of the transfer direction. The guide rails form a width corresponding to the width of the board K. Each opposing inside surface of the guide rail is provided with a belt guide 414 along the transfer direction. An endless conveyer belt 42 is operatively provided along the pair of guide rails 412, so as to be guided by the belt guides 414. The conveyer belt 42 is provided with a transfer pathway on the upper surface for transferring the board K thereon.

As shown in FIG. 3, the conveyer belt 42 is wound along a pair of front and rear transfer guide pulleys 421, a pair of front and rear return pulleys 422, a direction change pulley 423, a driving pulley 424 and a tensioner pulley 425. The driving pulley 424 is supported by a splined shaft 426 for unitary rotation therewith and the splined shaft 426 is connected to a pulse motor 427 and is driven thereby. Thus, the conveyer belt 42 is rotatably driven and moved with the board K thereon. The timing belt is used for the conveyer belt 42 and the timing pulleys are used for the driving pulley 424, the front and rear transfer guide pulleys 421 and the direction change pulley 423.

The clamp device 43 includes a base 432 from which a plurality of upright support pins 431 are projected upright. The support pins are arranged so as to be adaptable to a plurality types of the board K transferred. The base 432 is vertically movably guided by a plurality of pilot bars 433 and is vertically driven by a hydraulic cylinder 434. When the board K is guided by the guide rails 412 and transferred to the mounting position by the conveyer belt 42, the base 432 is lifted and the support pins 431 push the board K upwardly to clamp the board with the engaging projections 415 provided at the upper portion of the guide rails 412 (clamped at the position KK as indicated with a two-dot chain line in FIG. 2). The release and transfer of the board K are performed by lowering the base 432 and returning the board K onto the conveyer belt 42.

The board sensor 44 is formed with a light beam ejecting portion 441 provided at one of the pair of the guide rails 412 and a light beam receiving portion 442 provided at the other one of the pair of the guide rails 412. The light beam ejecting portion 441 and the light beam receiving portion 442 are oppositely arranged at the opposite sides of the conveyer belt 42 and positioned at somewhat upper stream side relative to the central position of the board transfer device 41. The light beam ejecting portion 441 ejects a light beam towards the light receiving portion 442 in a direction perpendicular to the transfer direction. The light beam receiving portion 442 receives the light beam ejected from the light beam ejecting portion 441 and sends a detection signal when the strength of the received light beam becomes lower than a predetermined value. In other words, the light beam receiving portion 442 sends the detection signal when the front end of the board K arrives in front of the light beam ejecting portion 441 and interrupts a portion of the light beam ejected therefrom. The attaching position of the board sensor 44 in a transfer direction is to be a reference position XS when the board K is transferred and stopped at a desired mounting position XZ (FIGS. 5 (1) and (2)).

Returning to FIG. 1, the feeder type component supply devices 45 are provided at opposite sides of the board transfer device 41. Each feeder type component supply device 45 includes a plurality of detachable cassette type feeders 451. Each cassette type feeder 451 contains a supply reel (not shown) around which an elongated tape is wound. The electronic components are sealed into the tape with a predetermined pitch. The tape is taken out from the reel with the predetermined pitch and the electronic components are unsealed from the tape. Each electronic component is then, in turn, sent to a component pick-up portion (not shown).

The component mounting device 47 has an X-direction beam arranged upward of the board transfer device 41, a Y-direction guide rail held movably in an X-axis direction on the X-direction beam and a mounting head held movably in a Y-axis direction on the Y-direction guide rail. The mounting head is movable in the X-axis direction, same as the board transfer direction and the Y-axis direction perpendicular to the X-axis direction within the horizontal plane. The mounting head picks up the electronic component from the feeder type component supply device 45 and mounts the picked up component to the board K which has been stopped at the mounting position XZ. The movement of the mounting head is controlled by a servo-motor using the coordinate system having the X-axis direction, Y-axis direction and a vertical Z-axis direction. The component mounting device 47 further includes a mark camera for recognizing a board mark marked on a predetermined position on the board K.

The second electronic component mounting machine 5 is arranged subsequent to the first electronic component mounting machine 4 and is provided with a tray type component supply device 55 at one side of the board transfer device 41, in addition to the feeder type component supply device 45. The tray type component supply device 55 has a tray 551 on which relatively large sized electronic components and seal cases are arranged next to one another for supplying thereof onto the board K by the component mounting device 47. The structure of the board transfer device 41 and the component mounting device 47 of this second electronic component mounting machine 5 are the same as those of the first electronic component mounting machine 4 and the explanation thereof is omitted. It is noted here that the structure of the third electronic component mounting machine 6 arranged subsequent to the second electronic component mounting machine 5 is the same as that of the first electronic component mounting machine 4 and the explanation thereof is also omitted.

In the structure explained above, some of the electronic components may be mounted on the board K with a part thereof being extended beyond the front end portion Kf of the board K in the second electronic component mounting machine 5. The present invention is preferably embodied in this board stopping control for the board K in the third electronic component mounting machine 6. In other words, the second electronic component mounting machine 5 corresponds to the one electronic component mounting machine and the third electronic component mounting machine 6 corresponds to the subsequent electronic component mounting machine arranged subsequent to the one of the electronic component mounting machines.

Figure 4:
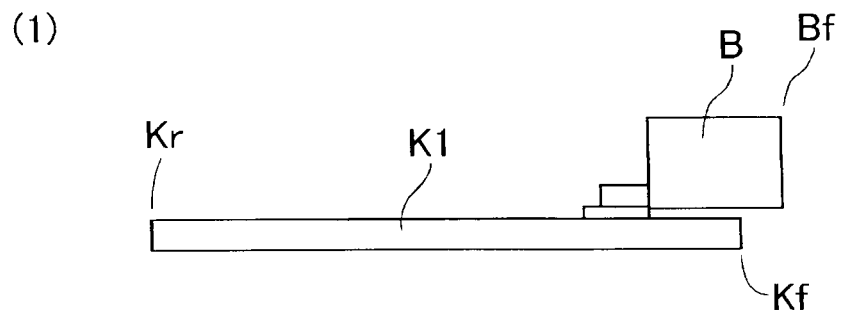
FIG. 4 (1) is a side view explaining an example of the calculating process for calculating the extended length when the connector part mounted on the board by the second electronic component mounting machine is extended beyond the front end of the board.
Figure 4:
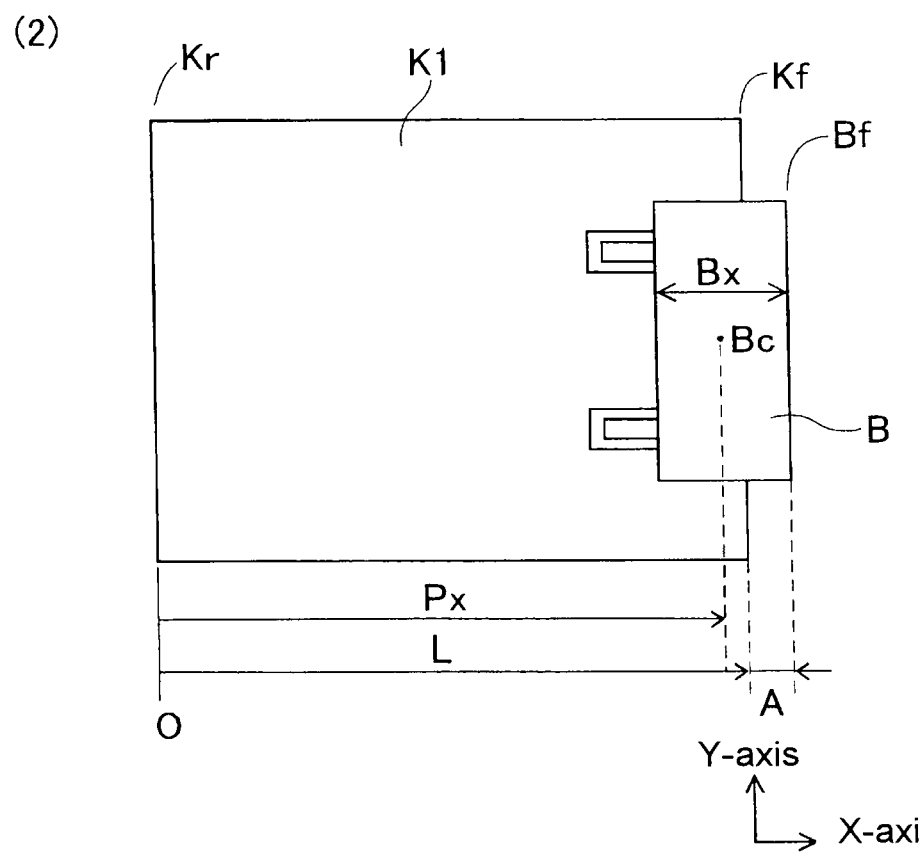

Next, the calculation step and the correcting and stopping process of the board stopping position control method according to this embodiment of the invention will be explained with a detail example. In FIG. 4, the calculation step is explained in the case where a connector component B mounted on the board K1 by the second electronic component mounting machine 5 is extended beyond the front end portion Kf of the board K1. FIG. 4(1) is a side view and FIG. 4(2) is a plane view for the explanation of the process. In the calculation step, the extended length A, or the extended distance from the front end portion Kf of the board K1 to the front end portion Bf of the connector component B is calculated. In more detail, upon mounting the connector component B at the second electronic component mounting machine 5, the mounting coordinate Px on the board K1 of the central position Bc of the connector component B is designated, with the coordinate origin O in X-axis direction being set at the rear end portion Kr of the board K1. Accordingly, if the size or the length of the connector component B in the transfer direction is set to be Bx as shown in FIG. 4(2), the front end portion Bf of the connector component B is represented as the coordinate value of "Px+Bx/2". If this coordinate value "Px+Bx/2" becomes larger than the size or the length L of the board K1 in the transfer direction, the connector component B is assumed to be extended beyond the front end portion Kf and the extended length A is represented as "Px+Bx/2−L".

Figure 5:
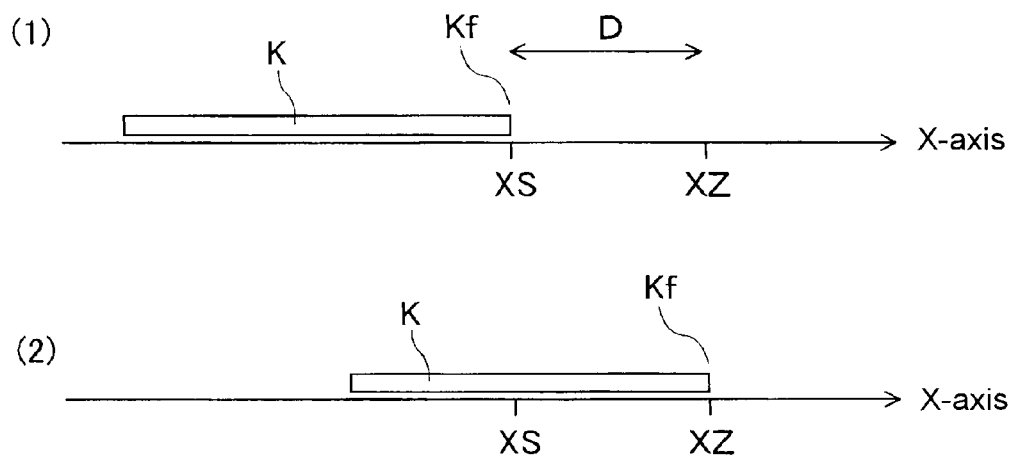
FIG. 5 (1) is a view explaining an example of the stopping process for stopping a normal board not having the extended length at the mounting position in the third electronic component mounting machine, wherein the position of the board is indicated at the time when the board sensor outputs a detection signal.

Next, the stopping step for a normal board K not having the extended length A will be explained with reference to FIG. 5. FIG. 5 is a drawing explaining an example of the stopping step for stopping the normal board K not having the extended length A at the mounting position XZ in the third electronic component mounting machine 6. FIG. 5 (1) indicates the position of the board K when the board sensor 44 outputs a detection signal and FIG. 5 (2) indicates the stopping position of the board K. In the drawings, horizontal axis indicates the transfer direction (X-axis direction) on the board transfer device 41 and the reference position XS indicates a fixed position on which the board sensor 44 is provided. Further, the mounting position XZ is a position for stopping the front end portion Kf of the board K so that the electronic component mounting operation can be effectively performed. This mounting position XZ can be variable depending on the type of the board K.

Here, it is noted that the distance D between the reference position XS and the mounting position XZ is a transfer distance which defines the stopping timing of the conveyer belt 42. In other words, the stopping timing is defined to be the moment when the conveyer belt 42 is driven by the distance D immediately after the board sensor 44 sent a detection signal. The conveyer belt 42 stops at this timing and accordingly the board K stops at this timing also.

When the board transfer device 41 of the third electronic component mounting machine 6 transfers the normal board K and the front end portion Kf of the board K reaches the reference position XS as shown in FIG. 5 (1), the board sensor 44 detects the front end portion Kf and sends a detection signal. Then the conveyer belt 42 stops at the stopping timing after being driven to circulate by an amount corresponding to the distance D. This will result in the accurate stopping at the mounting position XZ, where the front end portion Kf of the board K arrives at the mounting position XZ as shown in FIG. 5 (2).

Figure 6:
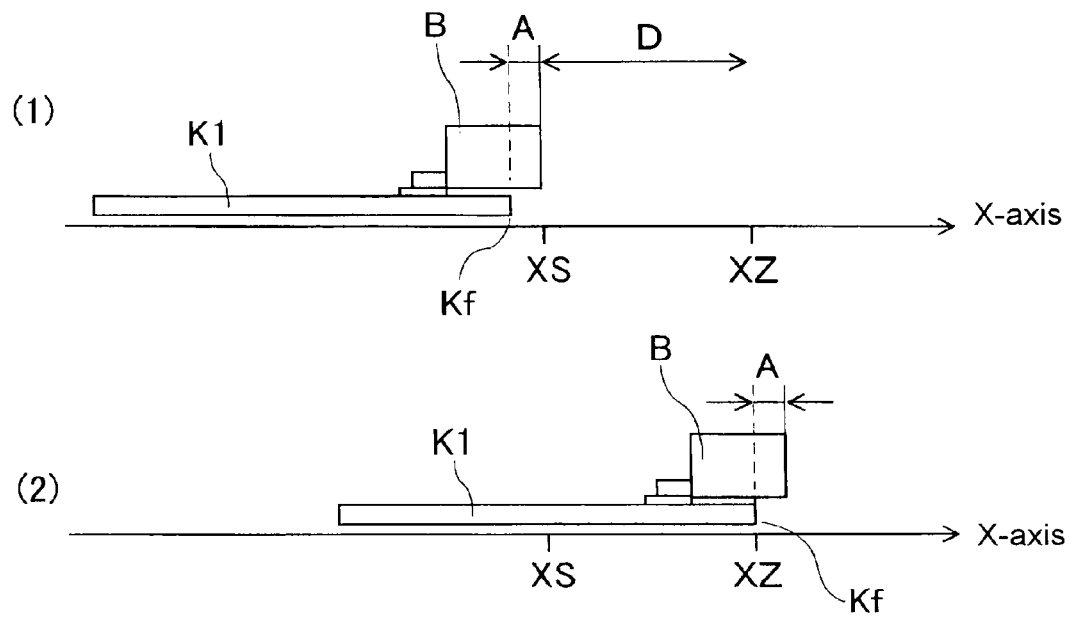
FIG. 6 (1) is a view explaining an example of the correcting and stopping process for stopping a board having the extended length shown in FIG. 4 at the mounting position in the third electronic component mounting machine, wherein the position of the board is indicated when the board sensor outputs a detection sensor.

Next, the correcting and stopping step for the board K1 having the extended length A will be explained in detail with reference to FIG. 6. FIG. 6 is a drawing explaining an example of the correcting and stopping step for stopping the board K1 having extended length A shown in FIG. 4 at the mounting position XZ in the third electronic component mounting machine 6. FIG. 6 (1) indicates the position of the board K1 immediately after the board sensor 44 sent the detection signal and FIG. 6 (2) indicates the stopping position of the board K1. In the drawings, the reference position XS is a fixed position and the mounting position XZ is a variable position set depending on the type of the board K1. Before transferring the board K1, the correcting is made by adding the extended length A to the distance D between the reference position XS and the mounting position XZ, which is set to be a corrected transfer distance for determining the stopping timing of the conveyer belt 42.

When the board transfer device 41 of the third electronic component mounting machine 6 transfers the board K1 having the extended length A and the front end portion Bf of the connector component B arrives at the reference position XS as shown in FIG. 6 (1), the board sensor 44 detects this position and sends a detection signal. At this timing, the front end portion Kf of the board K1 positions before the reference position XS by the extended length A. Accordingly, the conveyer belt 42 stops at the stopping timing, where the belt 42 has been driven circulating by the corrected transfer distance which is the distance of "D plus extended length A". This will result in the accurate stopping of the board K1 at the original mounting position XZ as shown in FIG. 6 (2).

After the correcting and stopping step, the clamp device 43 is operated to clamp and hold the board K1. Then, the mark camera takes the image and recognizes the reference mark on the board K1 to confirm the mounting position XZ. If a minute error at the position of the reference mark is found, the mounting coordinates of the electronic components are corrected to compensate for the error of the reference mark position. Then the component mounting device 47 is operated and the electronic components are mounted on the accurate coordinates compensated for the minute error.

Figure 7:
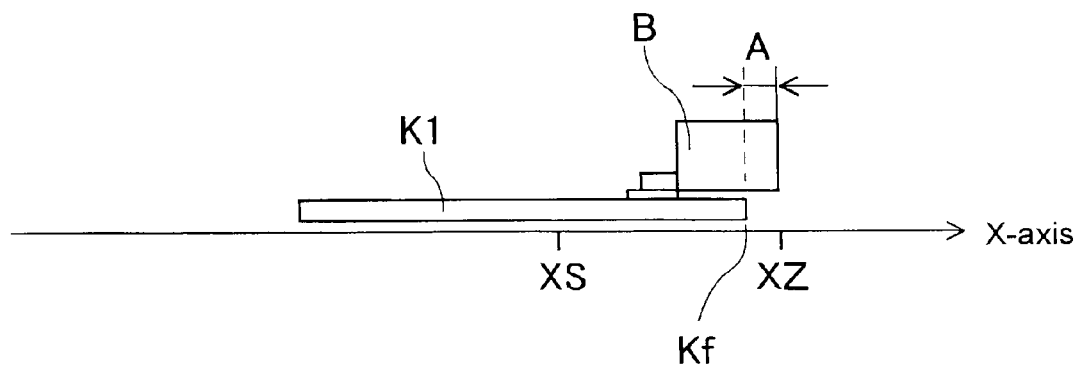
FIG. 7 is a view showing the stopping position of the board without performing the correcting and stopping process of the embodiment.

Without the correction of the transfer distance which defines the stopping timing of the conveyer belt 42 with respect to the board K1 having the extended length A, the stopping position of the board K1 becomes the position illustrated in FIG. 7. FIG. 7 shows the stopping position of the board K1 having the extended length A when the correcting and stopping step is not performed. The board K1 stops after moving from the position shown in FIG. 6 (1) by the distance D. This means that the board K1 stops before the mounting position XZ by the extended length A. As a result, the mark camera may not be able to take an image of the reference mark on the board K1. Even if the area wherein the mark camera can take the image of the reference mark is broadened more than a conventional one, still occurrence of erroneous recognition cannot be solved. For example, the mark camera may recognize another mark or may even misread a circuit pattern, such as, a through-hole as the reference mark. This may lead to erroneous correction of the mounting coordinate.

In contrast to this, according to the embodiment of the invention, since the conveyer belt 42 stops at the stopping timing after being driven to circulate by an amount corresponding to the transfer distance that is the sum of the extended length A and the distance D, the board K1 can be stopped accurately at the original mounting position XZ. Thus, the error generated at the recognition of the mounting position XZ is a minute error far smaller than the extended length A and the mark camera would not misread the mark. Therefore, each electronic component can be mounted on the corrected accurate coordinate.

The method for controlling the board stopping position according to the embodiment of the present invention is used in an electronic component mounting line 3 formed by a plurality of electronic component mounting machines 4, 5 and 6 arranged in series, each including a board transfer device 41 which transfers a board K1 along a transfer pathway by a conveyer belt 42 and stops the conveyer belt 42 to stop the board K1 thereon at a mounting position XZ based on a detection signal which is outputted from a board sensor 44 provided at a reference position XS on the transfer pathway when the board sensor 44 detects a board end portion Kf in a transfer direction (X-axis) of the board K1, a component supply device 45, 55 for supplying various kinds of electronic components which are to be mounted on the board K1 and a component mounting device 47 for picking the electronic component from the component supply device 45, 55 and mounting the picked electronic component on the board K1 stopped at the mounting position XZ, by moving in the transfer direction and in a direction perpendicular thereto. And the method for controlling the board stopping position comprises a calculation step for calculating an extended length A of the connector component B (electronic component) which is mounted on the board K1 and extended from the board end portion Kf in the transfer direction in one of the electronic component mounting machines 4, 5 and 6, a correcting and stopping step for correcting a stopping timing of the conveyer belt 42 to be stopped in response to the detection signal which is outputted from the board sensor 44 and stopping the board K1 at the mounting position XZ, based on the calculated extended length A of the connector component B in a subsequent stage electronic component mounting machine 6 arranged subsequent to the one of the electronic component mounting machines 5.

Accordingly, when the board sensor 44 of the subsequently arranged electronic component mounting machine 6 detects a component end portion Bf of the extended connector component B, in other words, when the board K1 is transferred to a position displaced by the extended length A from the reference position XS, the board sensor 44 outputs a detection signal. Even when such detection error is generated by the extended length at the reference position XS, this error can be corrected by correcting the conveyer belt 42 stopping position to accurately stop the board K1 at the original mounting position XZ.

And it is not necessary to add hardware for the sensor or image taking camera to the conventional equipment. The method for controlling the board stopping position can be easily achieved by adding only the computer software for calculating the extended length A and correcting the conveyer belt 42 stopping position to accurately stop the board K1 at the original mounting position XZ. A simple structure, a simple control logic and cost reduction can be achieved for the devices and the controllers.

In the embodiment, the board end portion is the frontward end portion Kf in a transfer direction (X-axis) of the board. Therefore, the board sensor 44 of the subsequent electronic component mounting machine 6 outputs a detection signal when the board K1 having a connector component B extended beyond the front end portion Kf of the board K1 is transferred to a position before the reference position XS by the extended length A. The board can be accurately stopped at the original mounting position XZ by adding the extended length A to the belt conveyer stopping position to correct the detection error at the reference position XS.

In the embodiment of the present invention, the calculation step includes a step for calculating the extended length of the electronic component in a frontward direction thereof using the formula "Px+Bx/2−L" under the condition that the value L is represented as L<(Px+Bx/2), wherein Px represents the mounting coordinate of the electronic component at the center position thereof, assuming that the origin of system of coordinates is set to be at the rear end portion of the board in the transfer direction, Bx represents the size of the electronic component in the transfer direction and L represents the length of the board in the transfer direction. Since the values Px, Bx and L are all known values, the extended length A can be easily obtained by a simple calculation formula.

The device for controlling the board stopping position according to the embodiment of the present invention is used in an electronic component mounting line 3 formed by a plurality of electronic component mounting machines 4, 5 and 6 arranged in series, each including a board transfer device 41 which transfers a board K1 along a transfer pathway by a conveyer belt 42 and stops the conveyer belt 42 to stop the board K1 thereon at a mounting position XZ based on a detection signal which is outputted from a board sensor 44 provided at a reference position XS on the transfer pathway when the board sensor 44 detects a board end portion Kf in a transfer direction (X-axis) of the board K1, a component supply device 45, 55 for supplying various kinds of electronic components which are to be mounted on the board K1 and a component mounting device 47 for picking the electronic component from the component supply device 45, 55 and mounting the picked electronic component on the board K1 stopped at the mounting position XZ, by moving in the transfer direction and in a direction perpendicular thereto. And the device for controlling the board stopping position comprises a calculation means for calculating an extended length A of the connector component B (electronic component) mounted on the board K1 and extended from the board end portion Kf in the transfer direction in one of the electronic component mounting machines 4, 5 and 6 and a correcting and stopping means for correcting a stopping timing of the conveyer belt 42 to be stopped in response to the detection signal which is outputted from the board sensor 44 and stopping the board K1 at the mounting position XZ, based on the calculated extended length A of the connector component B in a subsequent stage electronic component mounting machine 6 arranged subsequent to the one electronic component mounting machine 5.

Accordingly, the detection signal is outputted when the board sensor 44 of the subsequently arranged electronic component mounting machine 6 detects a component end portion Bf of the extended connector component B, wherein the board K1 is transferred to a position displaced by the extended length A from the reference position XS. Even when such detection error is generated by the extended length A at the reference position XS, this error can be corrected by correcting the conveyer belt 42 stopping position to accurately stop the board K1 at the original mounting position XZ.

The device for controlling the board stopping position can be achieved just by making software for a computer of a controller to perform the calculation step and the correcting and stopping step.

In the embodiment of the present invention, the board sensor 44 includes a light beam ejecting portion 441 for ejecting a light beam in a direction perpendicular to the transfer direction and a light beam receiving portion 442 positioned oppositely to the light beam ejecting portion 441 by sandwiching the transfer pathway therewith and outputting the detection signal upon receipt of the light beam ejected from the ejecting portion 441. The sensor 44 using the light beam in the embodiment is not affected by the surface condition of the board K1 or the connector component B (electronic component) compared to the sensor disclosed in JP2003-31991 A which detects the reflected light, and therefore the board sensor 44 of the embodiment can surely detect the front end portion Kf of the board K or the end portion Bf of the electronic component B which has been extended beyond the board end portion Kf. This can enhance an accurate stopping of the board at the mounting position XZ.

Next, another embodiment of the invention will be explained. In this modified embodiment, the error of positioning the board K1 to the mounting position XZ is permitted. In this embodiment, the calculation step is the same as the step explained with reference to FIG. 4 and accordingly, the extended length A is calculated. Then a stopping step that is the same as the stopping process for stopping a normal board not having the extended length A is carried out at the third electronic component mounting machine 6 to the board K1 having the extended length A, and the board K1 is stopped before the mounting position XZ by the extended length A as shown in FIG. 7. This error in stopping position can be anticipated in advance and accordingly, the error can be corrected when the electronic components are mounted on the board K1 at the correcting and mounting step explained hereinafter.

Figure 8:
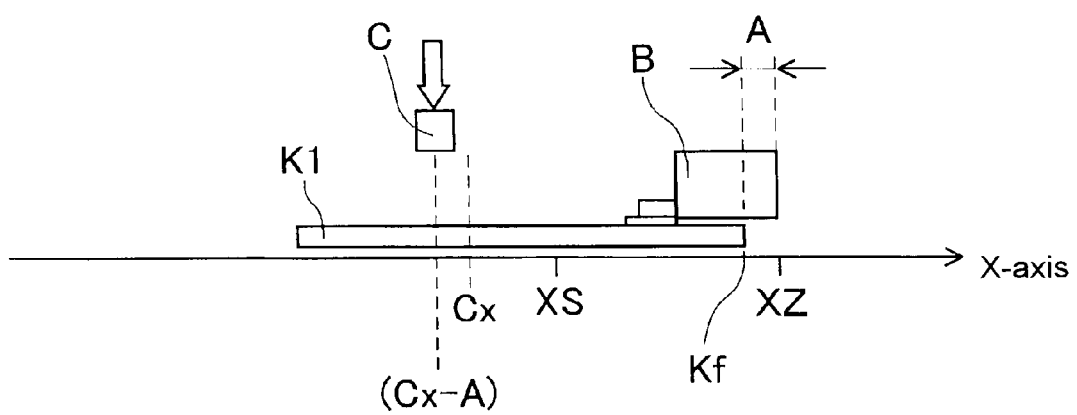
FIG. 8 is a view explaining an example of the correcting and stopping process to be performed for the board having the extended length shown in FIG. 4 in the third electronic component mounting machine according to another embodiment of the invention.

FIG. 8 is a drawing explaining an example of the correcting and mounting step to be carried out for the board K1 having the extended length A shown in FIG. 4 in the third electronic component mounting machine 6 according to the another embodiment of the invention. As shown in the drawing, the original mounting coordinate Cx of an electronic component C mounted by the component mounting device 47 of the third electronic component mounting machine 6 is corrected by subtracting the extended length A value from the value of the original coordinate Cx. The actual mounting coordinate becomes the value "Cx−A". This correcting is made to all operations associated with the accessing to the board K1, such as reference mark recognition operation. Thus, the basic object to mount the electronic component accurately on a predetermined mounting coordinate on the board K1 can be achieved.

The method for controlling the board stopping position according to the another embodiment of the present invention is use in an electronic component mounting line 3 formed by a plurality of electronic component mounting machines 4, 5 and 6 arranged in series, each including a board transfer device 41 which transfers a board K1 along a transfer pathway by a conveyer belt 42 and stops the conveyer belt 42 to stop the board K1 thereon at a mounting position XZ based on a detection signal which is outputted from a board sensor 44 provided at a reference position XS on the transfer pathway when the board sensor 44 detects a board end portion Kf in a transfer direction (X-axis) of the board K1, a component supply device 45, 55 for supplying various kinds of electronic components which are to be mounted on the board K1 and a component mounting device 47 for picking the electronic component from the component supply device 45, 55 and mounting the picked electronic component on the board K1 stopped at the mounting position XZ, by moving in the transfer direction and in a direction perpendicular thereto. And the method for controlling the board stopping position comprises a calculation step for calculating an extended length A of the connector component B (electronic component) which is mounted on the board K1 and extended from the board end portion Kf in the transfer direction in one of the electronic component mounting machines 4, 5 and 6, a stopping step for stopping the board K1 at the mounting position in response to the detection signal from the board sensor 44 in a subsequent stage electronic component mounting machine 6 arranged subsequent to the one of the electronic component mounting machines 5 and correcting and mounting step for correcting a mounting coordinate on which the electronic component is to be mounted based on the extended length A of the connector component B and mounting the electronic component on the board in the subsequent stage electronic component mounting machine 6.

Accordingly, when the board sensor 44 of the subsequently arranged electronic component machine 6 detects a component end portion Bf of the extended connector component B, in other words, when the board K1 is transferred to a position displaced by the extended length A from the reference position XS, the board sensor 44 outputs a detection signal. The detection error is generated by the extended length A at the reference position XS and may remain at the mounting position XZ. However, this error can be corrected by correcting the mounting coordinate to accurately stop the board K1 at the predetermined mounting coordinate.

According to this embodiment, the error generated at the mounting position XZ is allowed but is cancelled by correcting the mounting coordinate of the electronic component. This can achieve the basic object of the embodiment that the electronic components are accurately mounted at predetermined mounting coordinates.

The structure of the electronic component mounting machines 4, 5 and 6 in the component mounting line 3 may not be limited to the structures explained in the embodiments and changes or modifications may be made within the spirit of the invention as claimed. For example, the present invention can be applied to an inspection device which is arranged subsequent to the component mounting line 3 and is equipped with the board transfer device to stop the board at a predetermined inspection position.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A method for controlling a circuit board position during an assembly of electronic components in an electronic component mounting production line formed by a plurality of electronic component mounting machines arranged in series, each including a board transfer device which transfers a circuit board along a transfer pathway by a conveyer belt and stops the conveyer belt to stop the circuit board thereon at a mounting position based on a detection signal which is outputted from a board sensor provided at a reference position on the transfer pathway, a component supply device for supplying various kinds of electronic components which are to be mounted on the circuit board and a component mounting device for picking the electronic component from the component supply device and mounting the picked electronic component on the circuit board stopped at the mounting position, by moving in the transfer direction and in a direction perpendicular thereto, and in one of the plurality of electronic component mounting machines, an electronic component being mounted on the circuit board by the component mounting device in such a manner that a part of the electronic component is extended beyond an end portion of the circuit board, the method being for controlling a circuit board position in an electronic component mounting machine subsequent to the one of the electronic component mounting machines and comprising:

a calculation step for calculating an extended length of the part of the component, which extends from the end portion of the circuit board in the transfer direction, based on coordinates designated on the circuit board of the end portion thereof and of the electronic component mounted thereon and a size of the electronic component; and a correcting and stopping step for stopping the circuit board at the mounting position, wherein the board transfer device transfers the circuit board by a corrected transfer distance which is calculated by adding the extended length to a distance between the reference position and the mounting position after the board sensor outputs the detection signal when the board sensor detects an end portion of the electronic component.

2. The method for controlling a board stopping position according to claim 1, wherein the board end portion is a front end portion of the board in the transfer direction.

3. The method for controlling a board stopping position according to claim 1, wherein the calculation step includes a step for calculating the extended length of the electronic component in a frontward direction thereof by a formula "$Px+Bx/2-L$" under the condition that the value L is represented as $L<Px+Bx/2$, wherein Px represents mounting coordinate of the electronic component at the center position thereof, assuming that the origin of system of coordinates is set to be at the rear end portion of the board in the transfer direction, Bx represents the size of the electronic component in the transfer direction and L represents the length of the board in the transfer direction.

4. A device for controlling a circuit board position during an assembly of electronic components in an electronic component mounting production line formed by a plurality of electronic component mounting machines arranged in series, each including a board transfer device which transfers a circuit board along a transfer pathway by a conveyer belt and stops the conveyer belt to stop the circuit board thereon at a mounting position based on a detection signal which is outputted from a board sensor provided at a reference position on the transfer pathway, a component supply device for supplying various kinds of electronic components which are to be mounted on the circuit board and a component mounting device for picking the electronic component from the component supply device and mounting the picked electronic component on the board stopped at the mounting position, by moving in the transfer direction and in a direction perpendicular thereto, and in one of the plurality of electronic component mounting machines an electronic component being mounted on the circuit board by the component mounting device in such a manner that a part of the electronic component is extended beyond an end portion of the circuit board, the device being for controlling the circuit board position in an electronic component mounting machine subsequent to the one of the electronic component mounting machines and comprising:

a calculation means for calculating an extended length of the part of the component, which extends from the end portion of the circuit board in the transfer direction, based on coordinates designated on the circuit board of the end portion thereof and of the electronic component mounted thereon and a size of the electronic component; and a correcting and stopping means for stopping the board at the mounting position, wherein the board transfer device transfers the circuit board by a corrected transfer distance which is calculated by adding the extended length to a distance between the reference position and the mounting position after the board sensor outputs the detection signal when the board sensor detects an end portion of the electronic component.

5. The device for controlling a board stopping position according to claim 4, wherein the board sensor includes a light beam ejecting portion for ejecting a light beam in a direction perpendicular to the transfer direction and a light beam receiving portion positioned oppositely to the light beam ejecting portion by sandwiching the transfer pathway therewith and outputting the detection signal upon receipt of the light beam ejected from the ejecting portion.

6. A method for controlling a circuit board position during an assembly of electronic components in an electronic component mounting production line formed by a plurality of electronic component mounting machines arranged in series, each including a board transfer device which transfers a circuit board along a transfer pathway by a conveyer belt and stops the conveyer belt to stop the circuit board thereon at a mounting position based on a detection signal which is outputted from a board sensor provided at a reference position on the transfer pathway, a component supply device for supplying various kinds of electronic components which are to be mounted on the circuit board and a component mounting device for picking the electronic component from the component supply device and mounting the picked electronic component on the circuit board stopped at the mounting position, by moving in the transfer direction and in a direction perpendicular thereto, and in one of the plurality of electronic component mounting machines an electronic component being mounted on the circuit board by the component mounting device in such a manner that a part of the electronic component is extended beyond an end portion of the circuit board, the method being for controlling a circuit board position in an electronic component mounting machine subsequent to the one of the electronic component mounting machines and comprising:

a calculation step for calculating an extended length of the part of the electronic component, which extends from the end portion of the circuit board in the transfer direction, based on coordinates designated on the circuit board of the end portion thereof and of the electronic component mounted thereon and a size of the electronic component;

a stopping step for stopping the circuit board at a position before the mounting position by the extended length, wherein the board transfer device transfers the circuit board by a distance between the reference position and the mounting position after the board sensor outputs the detection signal when the board sensor detects an end portion of the electronic component; and a correcting and mounting step for correcting mounting coordinates on which the electronic components are mounted by the extended length and mounting the electronic components on the circuit board.

\* \* \* \* \*